United States Patent
Nozaki et al.

(10) Patent No.: US 7,741,666 B2
(45) Date of Patent: Jun. 22, 2010

(54) BACKSIDE ILLUMINATED IMAGING SENSOR WITH BACKSIDE P+ DOPED LAYER

(75) Inventors: Hidetoshi Nozaki, Sunnyvale, CA (US); Howard E. Rhodes, San Martin, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 0 days.

(21) Appl. No.: 12/140,848

(22) Filed: Jun. 17, 2008

(65) Prior Publication Data

US 2009/0200585 A1    Aug. 13, 2009

Related U.S. Application Data

(60) Provisional application No. 61/027,368, filed on Feb. 8, 2008.

(51) Int. Cl.
H01L 31/062 (2006.01)
H01L 31/113 (2006.01)
H01L 21/00 (2006.01)

(52) U.S. Cl. ............... 257/292; 257/82; 257/E27.133; 438/64; 438/73

(58) Field of Classification Search .............. 257/292, 257/346, 382, E27.133, 233, 40, 46, 80, 82; 438/199, 134, 22, 309, 48.57, 73, 64; 250/208.1, 250/214.1, 214 R, 238
See application file for complete search history.

(56) References Cited

U.S. PATENT DOCUMENTS

| | | | |
|---|---|---|---|
| 4,348,690 A | 9/1982 | Jastrzebski et al. | |
| 5,688,715 A | 11/1997 | Sexton et al. | |
| 6,429,036 B1 | 8/2002 | Nixon et al. | |
| 7,005,637 B2 | 2/2006 | Costello et al. | |
| 2003/0103150 A1* | 6/2003 | Catrysse et al. | 348/272 |
| 2004/0188727 A1* | 9/2004 | Patrick | 257/292 |
| 2004/0251398 A1 | 12/2004 | Mouli et al. | |
| 2006/0043519 A1 | 3/2006 | Ezaki | |
| 2006/0118836 A1* | 6/2006 | Rhodes | 257/292 |
| 2006/0180885 A1* | 8/2006 | Rhodes | 257/432 |
| 2006/0186560 A1 | 8/2006 | Swain et al. | |

(Continued)

FOREIGN PATENT DOCUMENTS

EP   1 612 863 A2   1/2006

(Continued)

OTHER PUBLICATIONS

Omnivision press-release dated by May 23, 2007 (see www.ovt.com/release.php?release=53&lang=english).*

(Continued)

*Primary Examiner*—Thomas L Dickey
*Assistant Examiner*—Nikolay Yushin
(74) *Attorney, Agent, or Firm*—Blakely Sokoloff Taylor & Zafman, LLP (57) ABSTRACT

A backside illuminated imaging sensor includes a semiconductor layer having a P-type region. A frontside and backside P+ doped layers are formed within the semiconductor layer. An imaging pixel having a photodiode is formed within the semiconductor layer, where the photodiode is an N− region formed within the P-type region of the semiconductor layer between the frontside P+ doped layer and the backside P+ doped layer.

25 Claims, 11 Drawing Sheets

U.S. PATENT DOCUMENTS

2006/0197007 A1  9/2006  Iwabuchi et al.
2007/0218578 A1  9/2007  Lee et al.
2007/0259463 A1  11/2007  Abedini

FOREIGN PATENT DOCUMENTS

EP  1 681 721 A2  7/2006

OTHER PUBLICATIONS

Micron press-release dated by May 18, 2006 (see http://www.micron.com/about/news/pressrelease.aspx?id=CDCB9899EFA2B68E.*
PCT/US2008/088254, PCT International Search Report and Written Opinion of the International Searching Authority, mailed Apr. 6, 2009, 10 pages.

* cited by examiner

BACKSIDE ILLUMINATED IMAGING SENSOR WITH BACKSIDE P+ DOPED LAYER

REFERENCE TO PRIOR APPLICATION

This application claims the benefit of U.S. Provisional Application No. 61/027,368, filed Feb. 8, 2008, hereby incorporated by reference.

TECHNICAL FIELD

This disclosure relates generally to imaging sensors, and in particular but not exclusively, relates to backside illuminated imaging sensors.

BACKGROUND INFORMATION

Many semiconductor imaging sensors today are front side illuminated. That is, they include imaging arrays that are fabricated on the front side of a semiconductor wafer, where light is received at the imaging array from the same front side. However, front side illuminated imaging sensors have many drawbacks, one of which is a limited fill factor.

Backside illuminated imaging sensors are an alternative to front side illuminated imaging sensors that address the fill factor problems associated with front side illumination. Backside illuminated imaging sensors include imaging arrays that are fabricated on the front surface of the semiconductor wafer, but receive light through a back surface of the wafer. However, to detect visible light from the backside, the wafer must be extremely thin. Micro-lenses may be included on the back surface of the wafer in order to improve the sensitivity of the backside illuminated sensor. The thickness of the wafer may be optimized in order to improve the spectral performance and reduce crosstalk. That is, as the final semiconductor wafer thickness is increased, light can be more effectively collected by the wafer. This is particularly true for red light, which penetrates deeper into silicon before being absorbed. At the same time, blue light, which is absorbed near the surface, may generate photoelectrons that recombine at the back surface, return to the back surface or are collected at a neighboring pixel. Photoelectrons that recombine at the back surface of the silicon may lead to reduced sensitivity, while photoelectrons that are collected at a neighboring pixel may lead to crosstalk of the imaging sensor. As the final semiconductor wafer thickness is decreased, more of the red light passes completely through the collection region without being absorbed and thereby further reduces sensitivity. Thus, a need exists for a backside illuminated device with improved sensitivity that reduces crosstalk.

BRIEF DESCRIPTION OF THE DRAWINGS

Non-limiting and non-exhaustive embodiments of the invention are described with reference to the following figures, wherein like reference numerals refer to like parts throughout the various views unless otherwise specified.

DETAILED DESCRIPTION

Embodiments of a Backside Illuminated Imaging Sensor with Backside P+ Doped Layer are described herein. In the following description numerous specific details are set forth to provide a thorough understanding of the embodiments. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Throughout this specification, several terms of art are used. These terms are to take on their ordinary meaning in the art from which they come, unless specifically defined herein or the context of their use would clearly suggest otherwise. "Quantum Efficiency" is defined herein as the ratio of the number of carriers generated to the number of photons incident upon an active region of an imaging sensor. "Dark Current" is defined herein as the current that flows in an imaging sensor in the absence of incident light on the imaging sensor. "White Pixel Defect" is defined herein as a pixel in an imaging sensor that includes an active region that has an excessive amount of current leakage.

Figure 1:
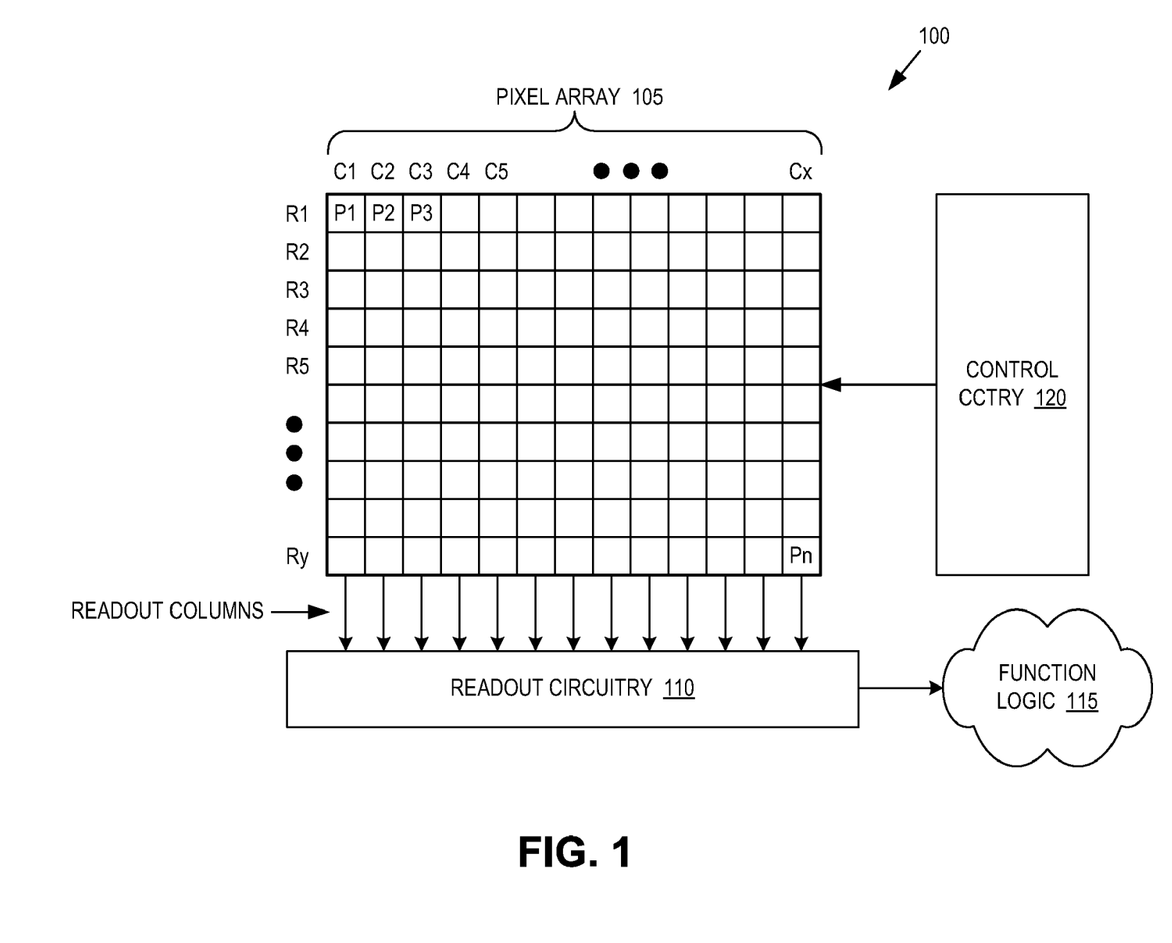
FIG. 1 is a block diagram illustrating a backside illuminated imaging sensor, in accordance with an embodiment of the invention.

FIG. 1 is a block diagram illustrating a backside illuminated imaging sensor 100, in accordance with an embodiment of the invention. The illustrated embodiment of imaging sensor 100 includes a pixel array 105, readout circuitry 110, function logic 115, and control circuitry 120.

Pixel array 105 is a two-dimensional ("2D") array of backside illuminated imaging sensors or pixels (e.g., pixels P1, P2 . . . , Pn). In one embodiment, each pixel is an active pixel sensor ("APS"), such as a complementary metal-oxide-semiconductor ("CMOS") imaging pixel. As illustrated, each pixel is arranged into a row (e.g., rows R1 to Ry) and a column (e.g., column C1 to Cx) to acquire image data of a person, place, or object, which can then be used to render a 2D image of the person, place, or object.

After each pixel has acquired its image data or image charge, the image data is readout by readout circuitry 110 and transferred to function logic 115. Readout circuitry 110 may include amplification circuitry, analog-to-digital conversion circuitry, or otherwise. Function logic 115 may simply storage the image data or even manipulate the image data by applying post image effects (e.g., crop, rotate, remove red eye, adjust brightness, adjust contrast, or otherwise). In one embodiment, readout circuitry 110 may readout a row of image data at a time along readout column lines (illustrated) or may readout the image data using a variety of other techniques (not illustrated), such as a serial readout or a full parallel readout of all pixels simultaneously.

Control circuitry 120 is coupled to pixel array 105 to control operational characteristic of pixel array 105. For example, control circuitry 120 may generate a shutter signal for controlling image acquisition.

Figure 2:
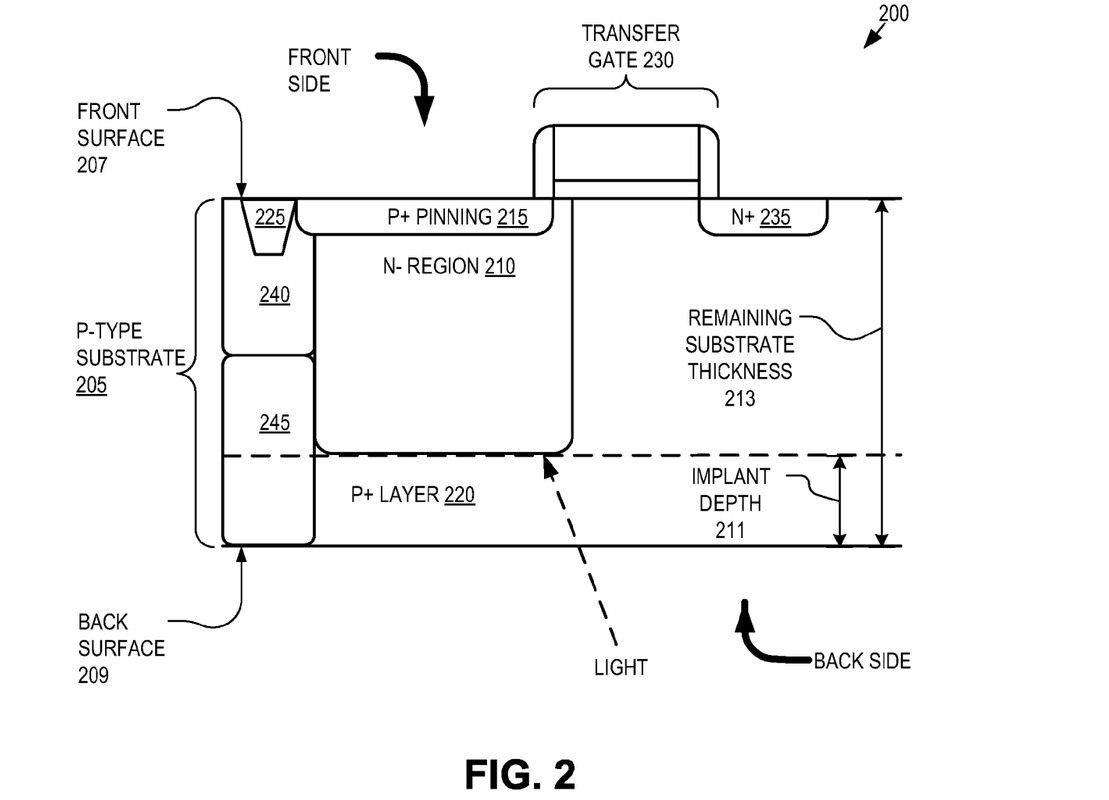
FIG. 2 is a cross-sectional view of an imaging pixel of a backside illuminated imaging sensor, in accordance with an embodiment of the invention.

FIG. 2 is a cross-sectional view of an imaging pixel 200 of a backside illuminated imaging sensor. Imaging pixel 200 is one possible implementation of at least one pixel of pixel array 105 shown in FIG. 1. The illustrated embodiment of imaging pixel 200 includes a semiconductor layer (i.e., P-type substrate 205). Formed within substrate 205 is a photodiode (i.e., N− region 210), a front side P+ doped layer (i.e., P+ pinning layer 215), a backside P+ doped layer 220, a shallow trench isolation ("STI") 225, a transfer gate 230, a floating diffusion (i.e., N+ region 235), a P-well 240, and a deep P-well 245.

Imaging pixel 200 is photosensitive to light incident upon the back surface 209 of substrate 205. In imaging pixel 200, the majority of photon absorption occurs near the back surface 209 of substrate 205. To separate the electron-hole pairs created by photon absorption and drive the electrons to N− region 210, an electric field near back surface 209 of substrate 205 is needed. Thus a highly doped P+ layer 220 is created by doping the back surface 209 of substrate 205 to create this electric field. In one embodiment, backside P+ layer 220 is created using boron doping and laser annealing. In one embodiment, N− region 210 is formed within substrate 205 to extend from P+ pinning layer 215 to backside P+ layer 220.

As shown in FIG. 2, backside P+ layer 220 is implanted to an implant depth 211 and substrate 205 has a remaining substrate thickness 213. In the illustrated embodiment, implant depth 211 represents the distance that backside P+ layer 220 extends into substrate 205 as measured from back surface 209. Remaining substrate thickness 213 represents the distance from back surface 209 to front surface 207. In accordance with the embodiments disclosed herein, implant depth 211, ion concentration of backside P+ layer 220, the slope of ion concentration in backside P+ layer 220, and/or remaining substrate thickness 213 may be selected as to increase (e.g., optimize) the spectral and overall performance of imaging pixel 200. For example, by careful selection of implant depth 211, ion concentration, and/or remaining substrate thickness 213, the quantum efficiency of imaging pixel 200 may be increased. In addition, dark current and white pixel defects may also be decreased.

In one embodiment, backside P+ layer 220 is a highly doped layer of boron. In one embodiment, boron doped layer may have a graded concentration of boron ions, where there is a higher concentration of boron ions near back surface 209 than there are at implant depth 211. For example, backside P+ layer 220 may have a boron ion concentration near back surface 209 in the range of approximately $1 \times 10^{18}$ ions/cm$^3$ to approximately $1 \times 10^{20}$ ions/cm$^3$, while the boron ion concentration near implant depth 211 may be approximately $1 \times 10^{15}$ ions/cm$^3$. By way of another example, backside P+ layer 220 may have a boron ion concentration near back surface 209 in the range of approximately $1 \times 10^{17}$ ions/cm$^3$ to approximately $1 \times 10^{20}$ ions/cm$^3$ and a boron ion concentration near implant depth 211 in the range of approximately $1 \times 10^{14}$ ions/cm$^3$ to approximately $2 \times 10^{15}$ ions/cm$^3$. In one embodiment, the boron doping of backside P+ layer 220 may be implemented using boron fluoride ($BF_2$) as the dopant or diborane ($B_2H_6$) as the dopant source.

Figure 3A:
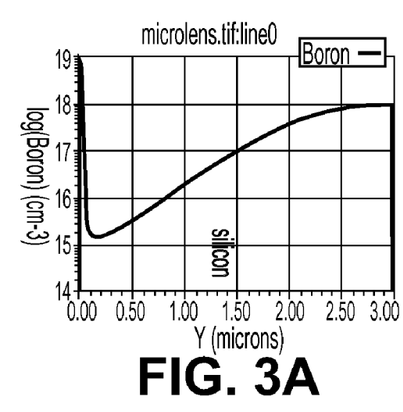
FIG. 3A illustrates a first ion concentration slope of a backside P+ doped layer.
Figure 3B:
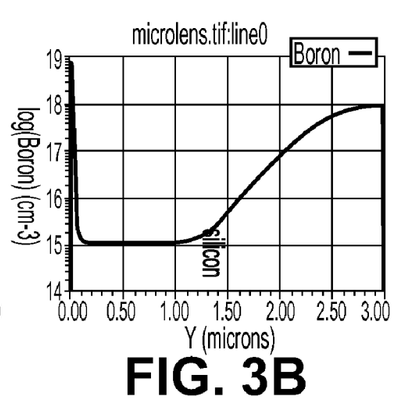
FIG. 3B illustrates a second ion concentration slope of a backside P+ doped layer.
Figure 3C:
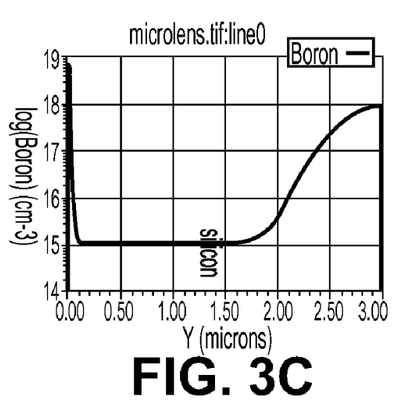
FIG. 3C illustrates a third ion concentration slope of a backside P+ doped layer.
Figure 3D:
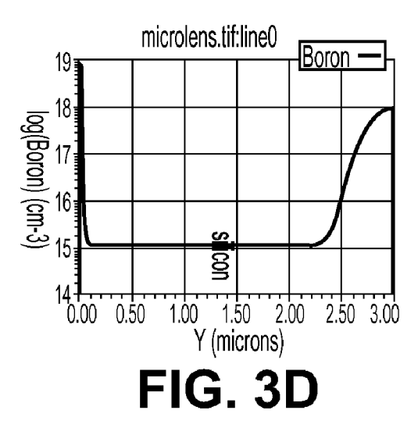
FIG. 3D illustrates a fourth ion concentration slope of a backside P+ doped layer.

The slope and concentration of boron ions may be selected to increase the quantum efficiency of imaging pixel 200. The boron doped layer may also have a slope and concentration of boron ions selected to decrease dark current and/or white pixel defects. For example, FIGS. 3A-3F illustrate various slopes of ion concentrations of a backside P+ doped layer, whereas FIG. 4 illustrates the sensitivity of the backside illuminated imaging sensor for these various ion concentration slopes. By way of example, FIG. 3A illustrates an embodiment of imaging pixel 200 having a backside P+ layer 220 having a small slope (i.e., gradual increase in ion concentrations) from approximately 0.1 microns to approximately 3.0 microns, as measured from back surface 209 of imaging pixel 200. As can be seen from FIG. 4, the sensitivity of the embodiment of FIG. 3A is shown in column A which indicates the sensitivity (in arbitrary units) of the imaging pixel 200 at various wavelengths (i.e., 450 nm, 550 nm, 620 nm, and 900 nm, etc.)

Figure 3E:
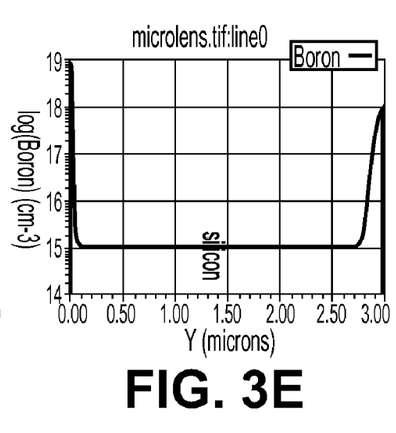
FIG. 3E illustrates a fifth ion concentration slope of a backside P+ doped layer.
Figure 3F:
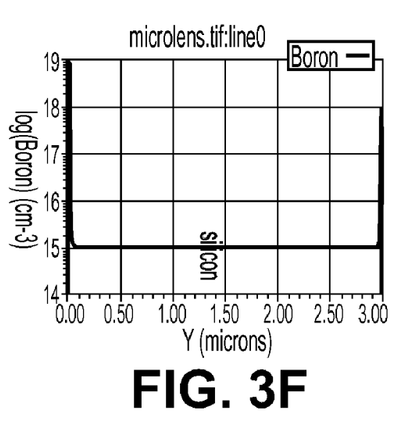
FIG. 3F illustrates a sixth ion concentration slope of a backside P+ doped layer.
Figure 4:
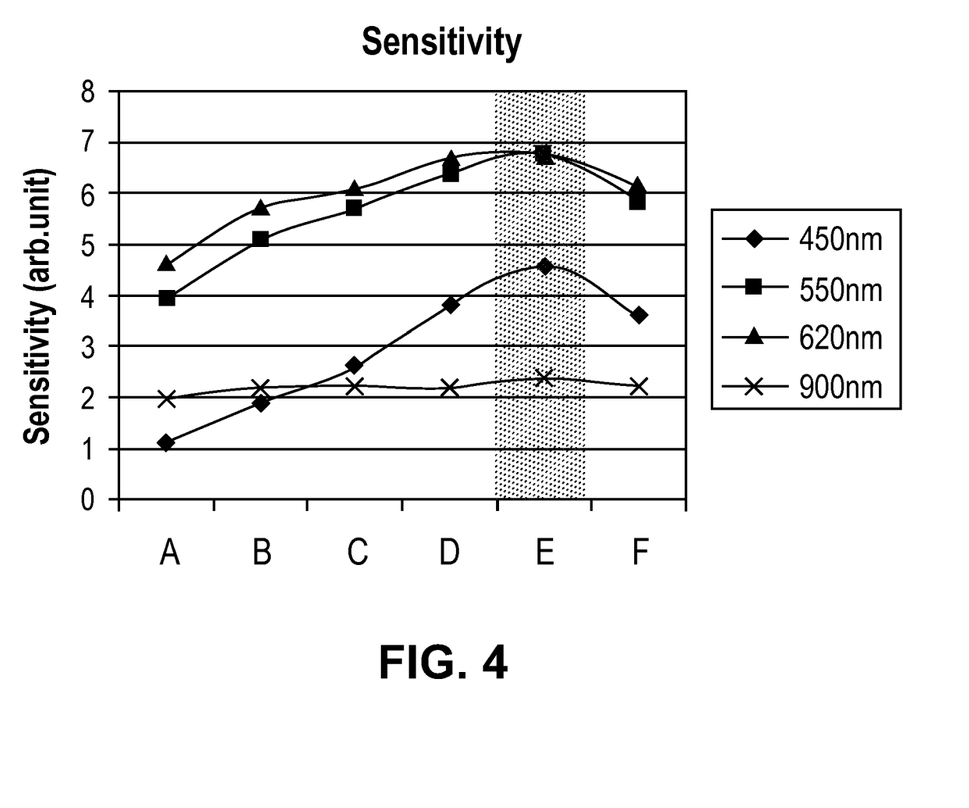
FIG. 4 illustrates the sensitivity of a backside illuminated imaging sensor for various ion concentration slopes of a backside P+ doped layer.

In contrast to the example of FIG. 3A, FIG. 3E illustrates a larger slope of ion concentrations, where the ion concentration increases rapidly from about 2.7 microns to about 3.0 microns. Further review of FIG. 4, shows that of these 6 embodiments, the ion concentration slope of FIG. 3E unexpectedly provides the greatest sensitivity at the illustrated wavelengths. That is, the embodiment of FIG. 3E has neither the smallest, nor greatest slope of the 6 illustrated embodiments. Thus, careful selection of ion concentration slope may be made to increase the quantum efficiency of an imaging pixel.

Figure 5:
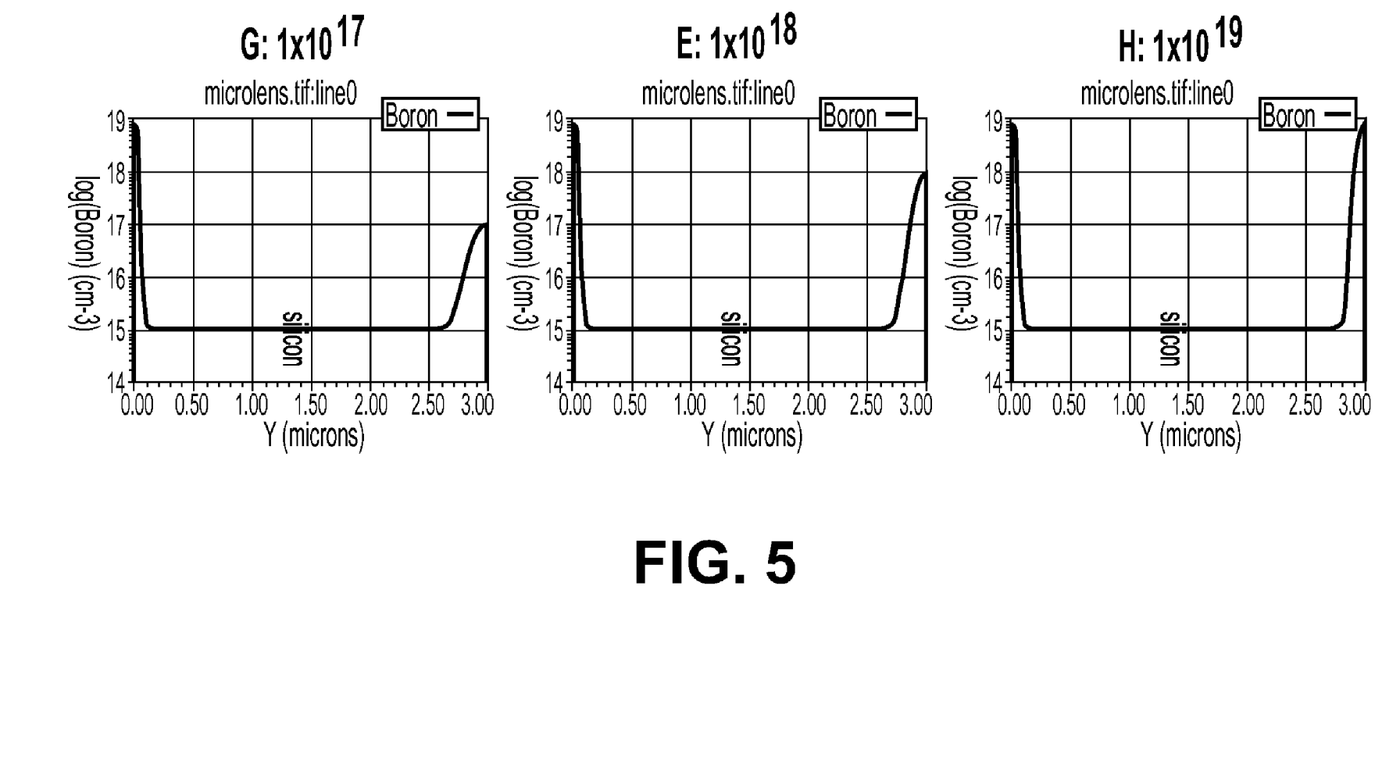
FIG. 5 illustrates various ion concentrations of a backside P+ doped layer.
Figure 6:
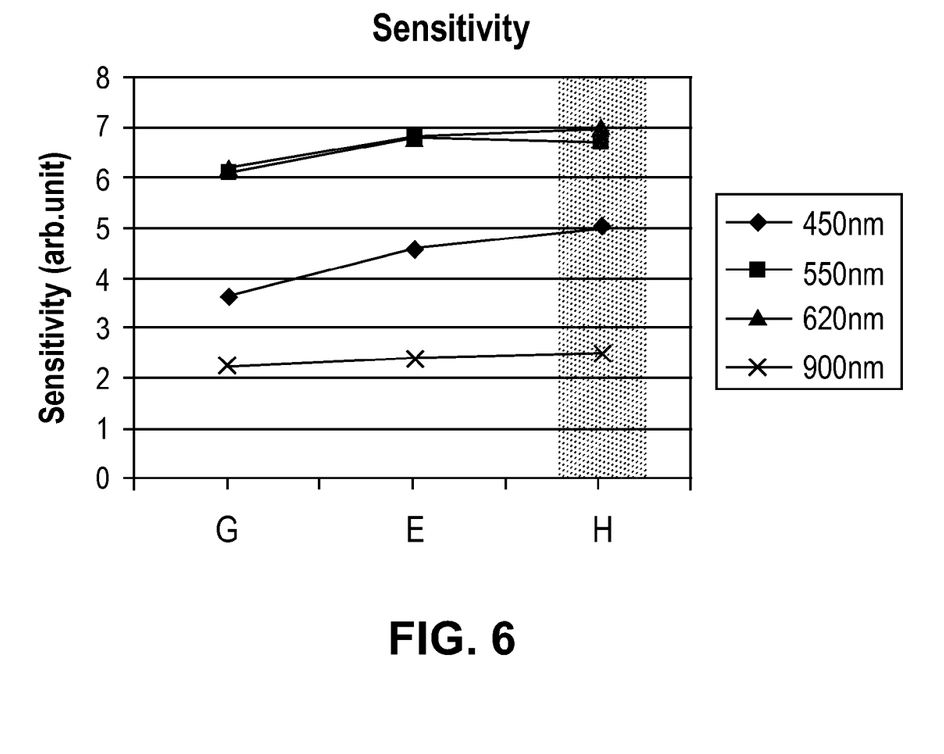
FIG. 6 illustrates the sensitivity of a backside illuminated imaging sensor for various ion concentrations of a backside P+ doped layer.

FIG. 5 illustrates various ion concentrations of a backside P+ doped layer, whereas FIG. 6 illustrates the sensitivity of the backside illuminated imaging sensor with these various ion concentrations. For example, chart G illustrates an ion concentration of $1 \times 10^{17}$ ions/cm$^3$ at an implant depth of 3.00 microns (i.e., implant depth 211); chart E illustrates an ion concentration of $1 \times 10^{18}$ ions/cm$^3$ at implant depth 3.00 microns; and chart H illustrates an ion concentration of $1 \times 10^{19}$ ions/cm$^3$ at implant depth 3.00 microns. Further review of FIG. 6, shows that of these 3 embodiments, the ion concentration of chart H (i.e., $1 \times 10^{19}$ ions/cm$^3$) will provide the greatest sensitivity at the illustrated wavelengths. Thus, careful selection of ion concentration may be made to increase the quantum efficiency of an imaging pixel.

As mentioned above, implant depth 211 may also be selected so as to increase quantum efficiency, and decrease dark current and white pixel defects. In one embodiment, implant depth 211 is in the range of approximately 100 nm to approximately 400 nm as measured from back surface 209. In another embodiment, implant depth 211 is in the range of approximately 50 nm to approximately 400 nm. In yet another embodiment, implant depth 211 is in the range of approximately 80 nm to approximately 200 nm.

Remaining substrate thickness 213 may also be selected so as to increase quantum efficiency, and decrease dark current and white pixel defects of imaging pixel 200. In one embodiment, remaining substrate thickness 213 may have preferred values dependent on the size of imaging pixel 200. For example, a ratio of remaining substrate thickness 213 to pixel size may be in the range of approximately 0.8 to 3.0. For a 1.75 micron pixel, remaining substrate thickness 213 may be approximately 3 microns, while for a 1.4 micron pixel, remaining substrate thickness 213 may be approximately 2.5 microns. In one embodiment, remaining substrate thickness 213 may be in the range of approximately 2 microns to approximately 4 microns for a 1.75 micron pixel. In another embodiment, remaining substrate thickness 213 may be in the range of approximately 1.4 microns to approximately 3.5 microns for a 1.75 micron pixel. For a 1.4 micron pixel, remaining substrate thickness 213 may be in the range of approximately 1.1 microns to approximately 2.8 microns. In yet another embodiment, remaining substrate thickness 213 may be in the range of approximately 1.9 microns to approximately 2.7 microns for a 1.4 micron pixel.

Figure 7:
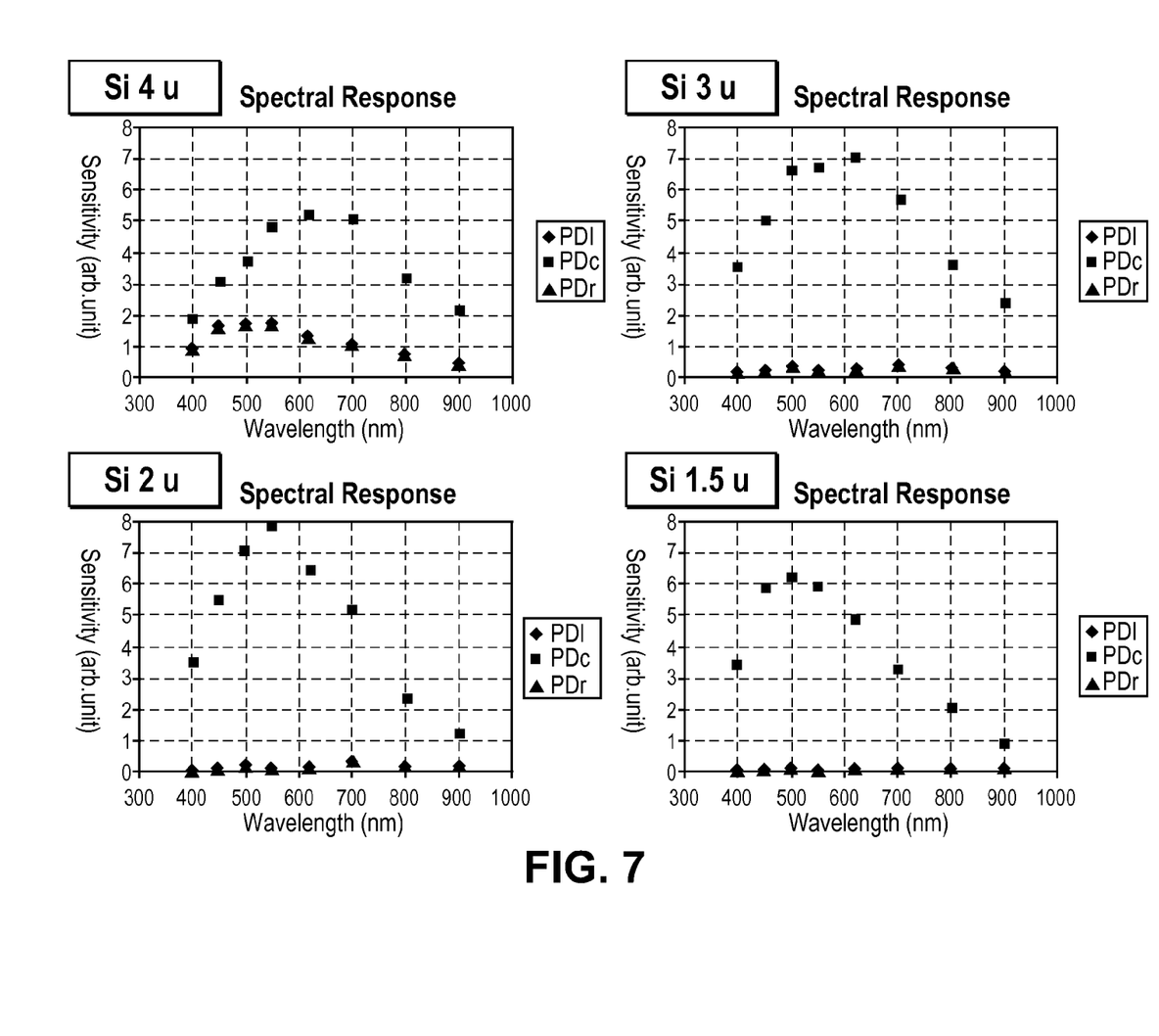
FIG. 7 illustrates the spectral responses for various remaining substrate thicknesses of a backside illuminated imaging sensor.
Figure 8:
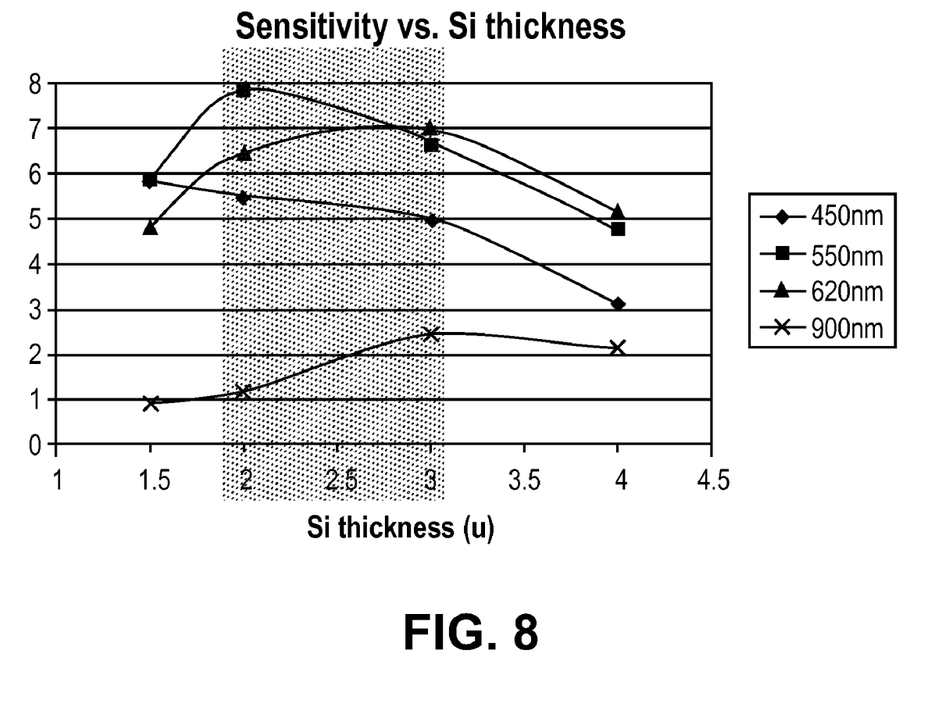
FIG. 8 illustrates the sensitivity of a backside illuminated imaging sensor for various remaining substrate thicknesses of a backside illuminated imaging sensor.

FIG. 7 illustrates the spectral responses for various remaining substrate thicknesses 213 of a backside illuminated imaging sensor, whereas FIG. 8 illustrates the sensitivity of the backside illuminated imaging sensor for these various remaining substrate thicknesses. Referring to FIG. 7, the chart labeled Si 4u illustrates the sensitivity (in arbitrary units) of an imaging pixel 200 having a remaining substrate thickness 213 of 4 microns. Similarly, the charts labeled Si 3u, Si 2u, Si 1.5u illustrate the sensitivity of an imaging pixel 200 having remaining substrate thicknesses of 3 microns, 2 microns and 1.5 microns, respectively. Further review of FIG. 8 shows that a remaining substrate thickness 213 in the range of 2 to 3 microns unexpectedly provides the greatest sensitivity at the illustrated wavelengths. That is, a remaining substrate thickness of 2 to 3 microns is neither the thinnest nor thickest of the 4 embodiments illustrated. Thus, careful selection of the remaining substrate thickness 213 may be made to increase the quantum efficiency of an imaging pixel.

In the illustrated embodiment of FIG. 2, P-well 240 and deep P-well 245 meet together with backside P$^+$ layer 220 to function as a complete isolation well between imaging pixels (e.g., between imaging pixel 200 and an adjacent imaging pixel (not shown)). In one example, deep P-well 245 is formed in P-type substrate 205 and P-well 240 is formed above the deep P-well 245. Shallow-trench isolation region 225 may be formed within P-well 240. In one example, deep P-well 245 extends to back surface 209 of substrate 205. In another example, deep P-well 245 may not extend all the way to back surface 209 provided backside P$^+$ layer 220 is sufficiently high-doped with boron.

Figure 9A:
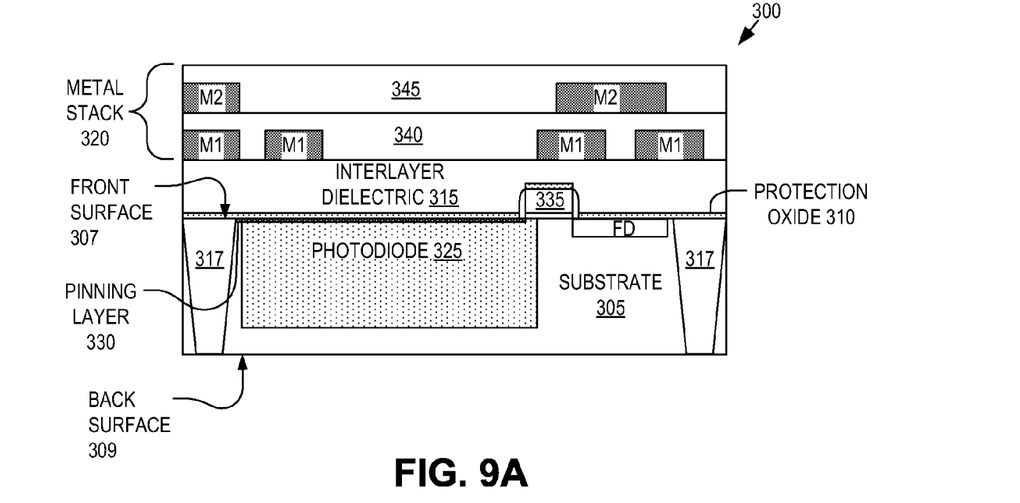
FIGS. 9A-9D illustrate a process of forming an imaging pixel of a backside illuminated imaging sensor, in accordance with an embodiment of the invention.

FIGS. 9A-9D illustrate a process of forming an imaging pixel 300 of a backside illuminated imaging sensor, in accordance with an embodiment of the invention. Imaging pixel 300 is one possible implementation of at least one pixel of pixel array 105 shown in FIG. 1. The illustrated embodiment of imaging pixel 300 shown in FIG. 9A includes a semiconductor layer (i.e., substrate 305), a protection oxide 310, an interlayer dielectric 315, and a metal stack 320. Substrate 305 is illustrated as including an isolation region 317, photodiode 325, a floating diffusion ("FD"), and a frontside P$^+$ doped layer (i.e., pinning layer 330). Metal stack 320 is illustrated as including metal interconnect layers M1 and M2, and intermetal dielectric layers 340 and 345. Also illustrated in FIG. 9A is a transfer gate 355.

In the illustrated embodiment of FIG. 9A, photodiode 325 is formed within substrate 305 from front surface 307. Photodiode 325 is configured to receive light from back surface 309. Photodiode 325 is illustrated as a pinned photodiode by way of optional pinning layer 330. In one embodiment, photodiode 325 may be an unpinned photodiode or a partially pinned photodiode. Additionally, photodiode 325 may be any photosensitive element, such as a photogate or photocapacitor. Furthermore, the term pixel as used herein is meant to encompass all pixel designs, including CCD pixels.

Also included in imaging pixel 300 is transfer gate 335 which is coupled to transfer charge that is accumulated in photodiode 325 to floating diffusion FD. In one embodiment, transfer gate 335 is a polycrystalline silicon (i.e., polysilicon) structure. Coupled to front surface 307 is protection oxide 310 and interlayer dielectric 315. In one embodiment interlayer dielectric 315 is silicon oxide.

Isolation region 317 may include one or more isolation wells such as STI 225, P-well 240, and deep P-well 245 as described with reference to FIG. 2. Isolation region 317 is configured to function either independently or in concert with a backside P$^+$ layer to provide a substantially complete isolation well between imaging pixels (e.g., between imaging pixel 300 and an adjacent imaging pixel (not shown)). In one example, isolation region 317 extends to back surface 309 of substrate 305. In another example, isolation region 317 may not extend all the way to back surface 309 provided a subsequent backside P$^+$ layer is sufficiently high-doped with boron.

As shown in FIG. 9A, imaging pixel 300 includes metal stack 320. The illustrated embodiment of metal stack 320 includes two metal layers M1 and M2 separated by intermetal dielectric layers 340 and 345. Although FIG. 9A illustrates a two layer metal stack, metal stack 320 may include more or less metal layers for routing signals above front surface 307 of substrate 305. In one embodiment metal interconnect layers M1 and M2 are a metal such as aluminum, copper, or other alloy. In one embodiment, metal interconnect layers M1 and M2 are formed by way of sputtering, collimated sputtering, low pressure sputtering, reactive sputtering, electroplating, chemical vapor deposition or evaporation. In one embodiment, transfer gate 335 and floating diffusion FD are electrically coupled to one or more of metal interconnect layers M1 and M2 by way of a hole, via or other connection means (not shown) through protection oxide 310 and interlayer dielectric 315. In one embodiment, a passivation layer (not shown) is disposed over metal stack 320.

In one embodiment, imaging pixel 300 includes silicide or metal light reflecting layer (not shown) disposed between metal stack 320 and front surface 307 of substrate 305. The light reflecting layer may be configured to reflect light that continues propagating through photodiode 325 back to the same photodiode 325 in order to reduce the effects of optical crosstalk and to increase the efficiency of photodiode 325. In one embodiment, light reflecting layer is disposed between protection oxide 310 and interlayer dielectric 315. In one embodiment, the light reflecting layer is disposed above the photodiode 325 and not above floating diffusion FD or transfer gate 335. In one embodiment, the light reflecting layer may have a concave shape so as to more accurately reflect light back onto photodiode 325.

Figure 9B:
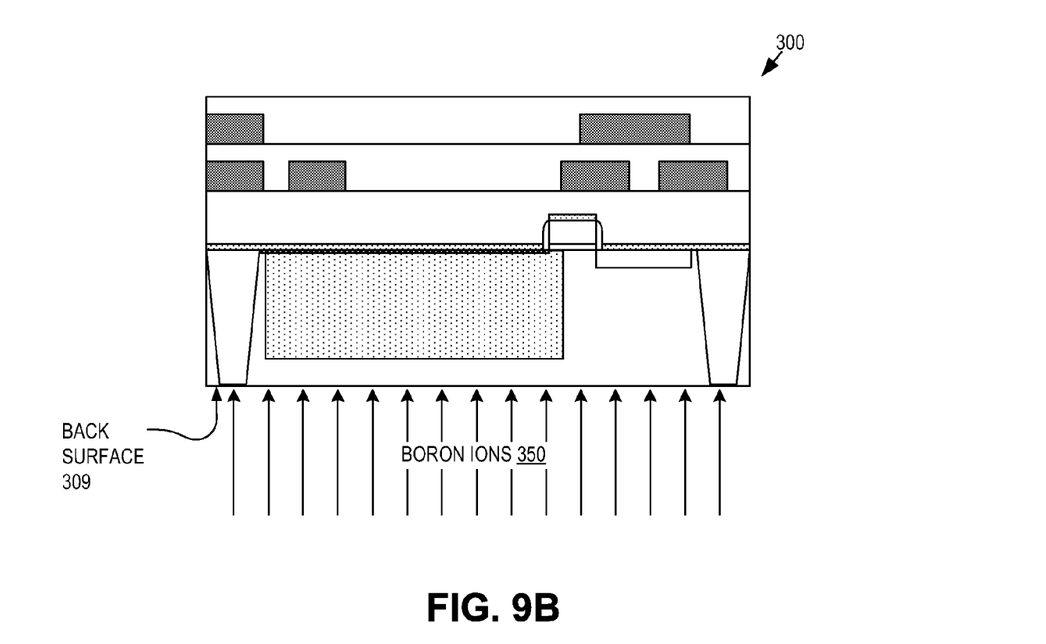

Now referring to FIG. 9B, a boron doping is performed at back surface 309. In one embodiment, the boron doping may be implemented using boron fluoride ($BF_2$) as the dopant or diborane ($B_2H_6$) as the dopant source. Improved performance of imaging pixel 300 may result from a dose range of boron ions 350 in the range of approximately $1\times10^3$ ions/cm$^2$ to approximately $1\times10^6$ ions/cm$^2$. Further improved performance of imaging pixel 300 may result from a dose range of boron ions 350 in the range of approximately $5\times10^{14}$ ions/cm$^2$ to approximately $5\times10^{15}$ ions/cm$^2$. In one embodiment, the dose range of boron ions 350 is in the range of approximately $5\times10^{13}$ ions/cm$^2$ to approximately $1\times10^{15}$ ions/cm$^2$.

Figure 9C:
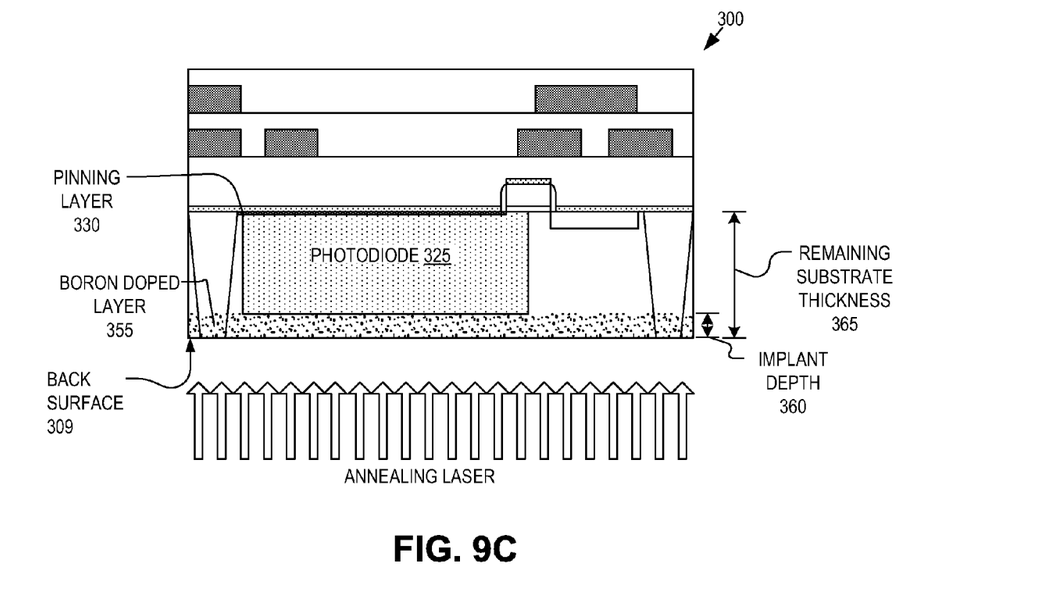

Turning now to FIG. 9C, the dopant implant process is followed by a laser annealing from back surface 309. The resulting backside P$^+$ doped layer is shown in FIG. 9C as boron doped layer 355. As shown in FIG. 9C, photodiode 325 (i.e., an N$^-$ region) is disposed between pinning layer 330 and boron doped layer 355. In one embodiment, photodiode 325 is directly coupled to pinning layer 330 and directly coupled to boron doped layer 355. Photo-electrons created near back surface 309 may now experience a vertical force towards front surface 307 due to the back surface P+ doping (i.e., boron doped layer 355).

In one embodiment, implant depth 360 is in the range of approximately 100 nm to approximately 400 nm as measured from back surface 309. In another embodiment, implant depth 360 is in the range of approximately 50 nm to approximately 400 nm. By way of example, implant depth 360 may be in the range of approximately 80 nm to approximately 200 nm.

Remaining substrate thickness 365 may have preferred values dependent on the size of imaging pixel 300. For example, for a 1.75 micron pixel, remaining substrate thickness 365 may be approximately 2-4 microns. In one example, a 1.75 micron pixel may have a remaining substrate thickness 365 in the range of approximately 1.4 microns to approximately 3.5 microns. For a 1.4 micron pixel, remaining substrate thickness 365 may be approximately 2.5 microns. In one example, a 1.4 micron pixel may have a remaining substrate thickness 365 in the range of approximately 1.1 microns to approximately 3 microns. In another example, a 1.4 micron pixel may have a remaining substrate thickness 365 in the range of approximately 1.9 microns to approximately 2.7 microns.

Figure 9D:
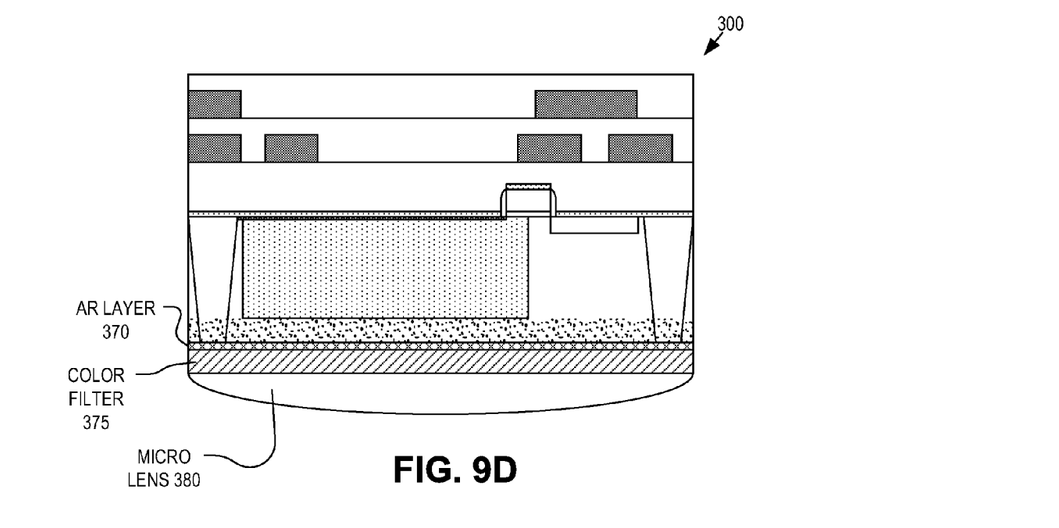

As shown in FIG. 9D, an optional color filter 375, micro-lens 380, and anti-reflective layer 370 are then coupled to back surface 309.

Figure 10:
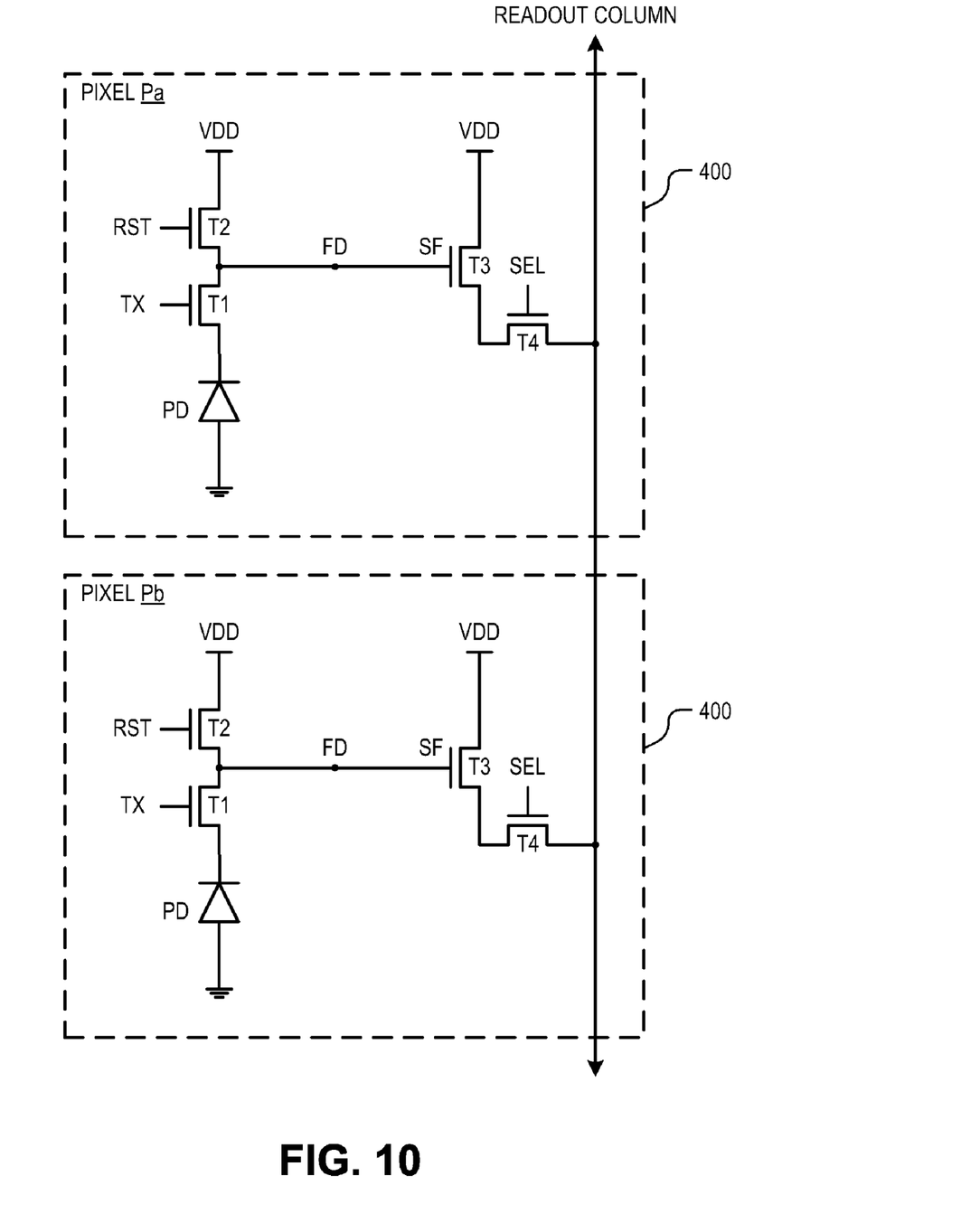
FIG. 10 is a circuit diagram illustrating pixel circuitry of two four-transistor ("4T") pixels within a backside illuminated imaging array, in accordance with an embodiment of the invention.

FIG. 10 is a circuit diagram illustrating pixel circuitry 400 of two four-transistor ("4T") pixels within a backside illuminated imaging array, in accordance with an embodiment of the invention. Pixel circuitry 400 is one possible pixel circuitry architecture for implementing each pixel within pixel array 100 of FIG. 1, pixel 200 of FIG. 2, or pixel 300 of FIG. 9D. However, it should be appreciated that embodiments of the present invention are not limited to 4T pixel architectures; rather, one of ordinary skill in the art having the benefit of the instant disclosure will understand that the present teachings are also applicable to 3T designs, 5T designs, and various other pixel architectures.

In FIG. 10, pixels Pa and Pb are arranged in two rows and one column. The illustrated embodiment of each pixel circuitry 400 includes a photodiode PD, a transfer transistor T1, a reset transistor T2, a source-follower ("SF") transistor T3, and a select transistor T4. During operation, transfer transistor T1 receives a transfer signal TX, which transfers the charge accumulated in photodiode PD to a floating diffusion node FD.

Reset transistor T2 is coupled between a power rail VDD and the floating diffusion node FD to reset (e.g., discharge or charge the FD to a preset voltage) under control of a reset signal RST. The floating diffusion node FD is coupled to the gate of SF transistor T3. SF transistor T3 is coupled between the power rail VDD and select transistor T4. SF transistor T3 operates as a source-follower providing a high impedance output from floating diffusion node FD. Finally, select transistor T4 selectively couples the output of pixel circuitry 500 to the readout column line under control of a select signal SEL. In one embodiment, the TX signal, the RST signal, and the SEL signal are generated by control circuitry 120. The TX signal, the RST signal, the SEL signal, VDD, and ground may be routed in pixel circuitry 500 by way of metal interconnect layers M1 and M2. In one embodiment, transistors T1, T2, T3, and T4, photodiode PD and floating diffusion node FD may be connected as shown in FIG. 10 by way of metal interconnect layers M1 and M2.

The above description of illustrated embodiments of the invention, including what is described in the Abstract, is not intended to be exhaustive or to limit the invention to the precise forms disclosed. While specific embodiments of, and examples for, the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific embodiments disclosed in the specification. Rather, the scope of the invention is to be determined entirely by the following claims, which are to be construed in accordance with established doctrines of claim interpretation.

What is claimed is:

1. A complementary metal-oxide-semiconductor ("CMOS") backside illuminated imaging sensor, comprising:
   a semiconductor layer having a P-type region;
   a frontside P$^+$ doped layer formed within the semiconductor layer;
   a backside P$^+$ doped layer formed within the semiconductor layer, wherein the backside P+ doped layer has a graded concentration of a first dopant extending from a back surface of the semiconductor layer to a first distance from the back surface of the semiconductor layer such that a first concentration of the first dopant at the back surface of the semiconductor layer is greater than a second concentration of the first dopant at the first distance from the back surface of the semiconductor layer; and
   an imaging pixel having a photodiode formed within the semiconductor layer, wherein the photodiode is an N$^-$ region formed within the P-type region of the semiconductor layer between the frontside P$^+$ doped layer and the backside P$^+$ layer.

2. The backside illuminated imaging sensor of claim 1, wherein the imaging pixel further includes:
   a floating diffusion region within the semiconductor layer proximate to a front surface of the semiconductor layer; and
   a transfer gate coupled between the photodiode and the floating diffusion.

3. The backside illuminated imaging sensor of claim 1, further comprising:
   a micro-lens disposed on a back surface of the semiconductor layer below the backside P$^+$ doped layer and optically aligned to focus light through the back surface of the semiconductor layer, through the backside P$^+$ doped layer and onto the photodiode; and
   a color filter disposed between the micro-lens and the photodiode to filter the light.

4. The backside illuminated imaging sensor of claim 3, further comprising an anti-reflective coating disposed between the color filter and the back surface of the semiconductor layer to substantially prevent reflection of the light.

5. The backside illuminated imaging sensor of claim 1, wherein the backside P+ doped layer is a boron doped layer.

6. The backside illuminated imaging sensor of claim 5, wherein the boron doped layer includes boron fluoride ($BF_2$).

7. The backside illuminated imaging sensor of claim 5, wherein the boron doped layer includes boron derived from a diborane ($B_2H_6$) source.

8. The backside illuminated imaging sensor of claim 5, wherein the boron doped layer has an ion concentration selected to increase a quantum efficiency of the imaging pixel.

9. The backside illuminated imaging sensor of claim 5, wherein the boron doped layer has an ion concentration selected to reduce one or more of dark current and white pixel defects.

10. The backside illuminated imaging sensor of claim 9, wherein the boron doped layer has a first ion concentration of boron at the back surface of the semiconductor layer and has a second ion concentration of boron at the first distance from the back surface of the semiconductor layer, wherein the first ion concentration is greater than the second ion concentration.

11. The backside illuminated imaging sensor of claim 10, wherein the first ion concentration is in the range of approximately $1\times10^{17}$ ions/cm$^3$ to approximately $1\times10^{20}$ ions/cm$^3$.

12. The backside illuminated imaging sensor of claim 10, wherein the second ion concentration is in the range of approximately $1\times10^{14}$ ions/cm$^3$ to approximately $2\times10^{15}$ ions/cm$^3$.

13. The backside illuminated imaging sensor of claim 12, wherein the distance between the second ion concentration and the back surface of the semiconductor layer is in the range of approximately 50 nm to approximately 400 nm.

14. The backside illuminated imaging sensor of claim 12, wherein the distance between the second ion concentration and the back surface of the semiconductor layer is in the range of approximately 80 nm to approximately 200 nm.

15. The backside illuminated imaging sensor of claim 10, wherein a distance between the back surface and a front surface of the semiconductor layer is selected to increase a quantum efficiency of the imaging pixel.

16. The backside illuminated imaging sensor of claim 15, wherein the imaging pixel is a 1.75 micron CMOS backside illuminated imaging pixel and the distance between the back surface and the front surface of the semiconductor layer is in the range of approximately 2 microns to approximately 4 microns.

17. The backside illuminated imaging sensor of claim 15, wherein the imaging pixel is a 1.75 micron CMOS backside illuminated imaging pixel and the distance between the back surface and the front surface of the semiconductor layer is in the range of approximately 2.3 microns to approximately 3.5 microns.

18. The backside illuminated imaging sensor of claim 15, wherein the imaging pixel is a 1.4 micron CMOS backside illuminated imaging pixel and the distance between the back surface and the front surface of the semiconductor layer is in the range of approximately 1.5 microns to approximately 3.0 microns.

19. The backside illuminated imaging sensor of claim 15, wherein the imaging pixel is a 1.4 micron CMOS backside illuminated imaging pixel and the distance between the back surface and the front surface of the semiconductor layer is in the range of approximately 1.9 microns to approximately 2.7 microns.

20. An imaging sensor comprising:
a semiconductor layer having a front surface and a back surface, the semiconductor layer having a complementary metal-oxide-semiconductor ("CMOS") backside illuminated array of imaging pixels, wherein each imaging pixel includes:
a frontside P+ doped layer formed within the semiconductor layer;
a backside P+ doped layer formed within the semiconductor layer,
wherein the backside P+ doped layer has a graded concentration of a first dopant extending from the back surface of the semiconductor layer to a first distance from the back surface of the semiconductor layer such that a first concentration of the first dopant at the back surface of the semiconductor layer is greater than a second concentration of the first dopant at the first distance from the back surface of the semiconductor layer; and
a photodiode formed within the semiconductor layer, wherein the photodiode is an N$^-$ region formed within the P-type region between the frontside P+ doped layer and the backside P+ layer.

21. The imaging sensor of claim 20, wherein the backside P+ doped layer is a boron doped layer.

22. The imaging sensor of claim 21, wherein the boron doped layer has a first ion concentration of boron at the back surface of the semiconductor layer and has a second ion concentration of boron at the first distance from the back surface of the semiconductor layer, wherein the first ion concentration is greater than the second ion concentration.

23. The imaging sensor of claim 20, wherein each imaging pixel further includes:
a floating diffusion region formed within the semiconductor layer; and
a transfer gate coupled between the photodiode and the floating diffusion region.

24. A method of fabricating an array of complementary metal-oxide-semiconductor ("CMOS") backside illuminated imaging pixels, comprising:
fabricating a plurality of photodiodes within a semiconductor layer from a front surface of the semiconductor layer, wherein the plurality of photodiodes are N$^-$ regions formed within a P-type region;
implanting a frontside P+ doped layer within the semiconductor layer from the front surface of the semiconductor layer; and
implanting a backside P+ doped layer within the semiconductor layer from a back surface of the semiconductor layer, wherein the backside P+ doped layer has a graded concentration of a first dopant extending from the back surface of the semiconductor layer to a first distance from the back surface of the semiconductor layer such that a first concentration of the first dopant at the back surface of the semiconductor layer is greater than a second concentration of the first dopant at the first distance from the back surface of the semiconductor layer, wherein the N$^-$ region is disposed between the frontside P+ doped layer and the backside P+ doped layer.

25. The method of claim 24, wherein the boron doped layer has a first ion concentration at the back surface of the semiconductor layer and has a second ion concentration at the first distance from the back surface of the semiconductor layer, wherein the first ion concentration is greater than the second ion concentration.

* * * * *